United States Patent [19]

Guha et al.

[11] Patent Number: 5,204,272
[45] Date of Patent: Apr. 20, 1993

[54] SEMICONDUCTOR DEVICE AND MICROWAVE PROCESS FOR ITS MANUFACTURE

[75] Inventors: Subhendu Guha, Troy; Arindam Banerjee, Madison Heights; Chi C. Yang, Troy, all of Mich.

[73] Assignee: United Solar Systems Corporation, Troy, Mich.

[21] Appl. No.: 808,209

[22] Filed: Dec. 13, 1991

[51] Int. Cl.$^5$ ............... H01L 31/18; H01L 21/205
[52] U.S. Cl. ........................... 437/4; 437/101; 437/109; 437/106; 437/113; 427/74; 427/575; 136/258; 357/30
[58] Field of Search ............ 437/4, 101, 106, 108-109, 437/113, 170; 427/39, 45.1, 74; 136/258 AM; 357/30 J, 30 K

[56] References Cited

U.S. PATENT DOCUMENTS

| | | | |
|---|---|---|---|
| 4,379,943 | 4/1983 | Yang et al. | 136/249 |
| 4,471,155 | 9/1984 | Mohr et al. | 136/258 |
| 4,517,223 | 5/1985 | Ovshinsky et al. | 427/39 |
| 4,547,621 | 10/1985 | Hack et al. | 136/249 TJ |
| 4,582,773 | 4/1986 | Johncock et al. | 430/65 |
| 4,619,729 | 10/1986 | Johncock et al. | 156/606 |
| 4,816,082 | 3/1989 | Guha et al. | 136/249 |
| 4,908,330 | 3/1990 | Arai et al. | 437/170 |
| 4,951,602 | 8/1990 | Kanai | 118/719 |
| 4,957,772 | 9/1990 | Saitoh et al. | 427/39 |
| 4,971,832 | 11/1990 | Arai et al. | 427/39 |
| 4,995,341 | 2/1991 | Matsuyama | 118/723 |
| 4,998,503 | 3/1991 | Murakami et al. | 118/723 |
| 5,021,103 | 6/1991 | Hamakawa et al. | 148/33 |
| 5,114,770 | 5/1992 | Echizen et al. | 427/38 |
| 5,129,359 | 7/1992 | Takei et al. | 118/723 |
| 5,130,170 | 7/1992 | Kanai et al. | 427/38 |

FOREIGN PATENT DOCUMENTS

| | | | |
|---|---|---|---|
| 62-7859 | 1/1987 | Japan | 136/258 AM |
| 62-144370 | 6/1987 | Japan | 136/258 AM |

OTHER PUBLICATIONS

K. Kobayashi et al, *Jap. J. Appl. Phys.*, vol. 26, pp. 202-208 (1987).
Y. H. Shing, *Solar Cells*, vol. 27, pp. 331-340 (1989).
Y. H. Shing et al, *Solar Cells*, vol. 30, pp. 391-401 (1991).

*Primary Examiner*—Aaron Weisstuch
*Attorney, Agent, or Firm*—Krass & Young

[57] ABSTRACT

Open circuit voltage of photovoltaic devices manufactured by a microwave deposition process is increased by disposing a bias wire in the microwave energized plasma and applying a positive voltage of approximately 100 volts to the wire during only a portion of the time in which the intrinsic semiconductor layer is being deposited.

16 Claims, 5 Drawing Sheets

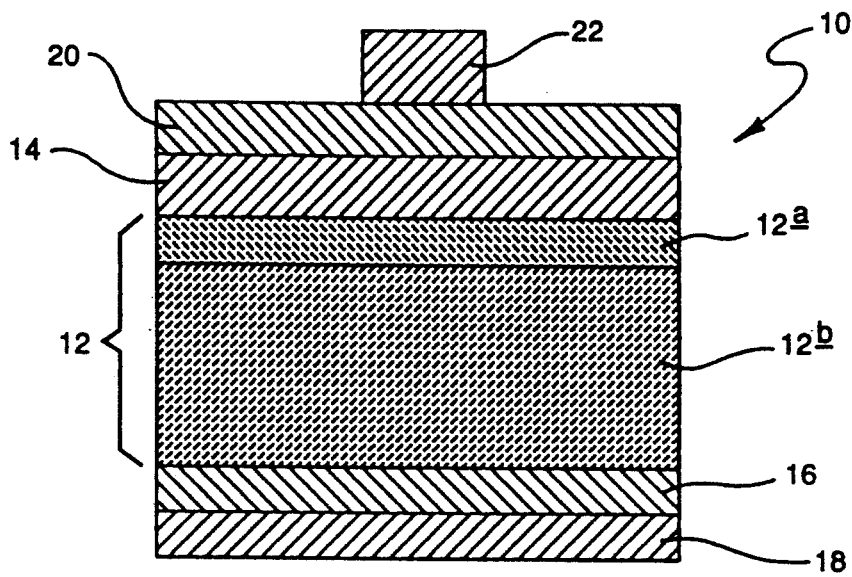
FIG - 1
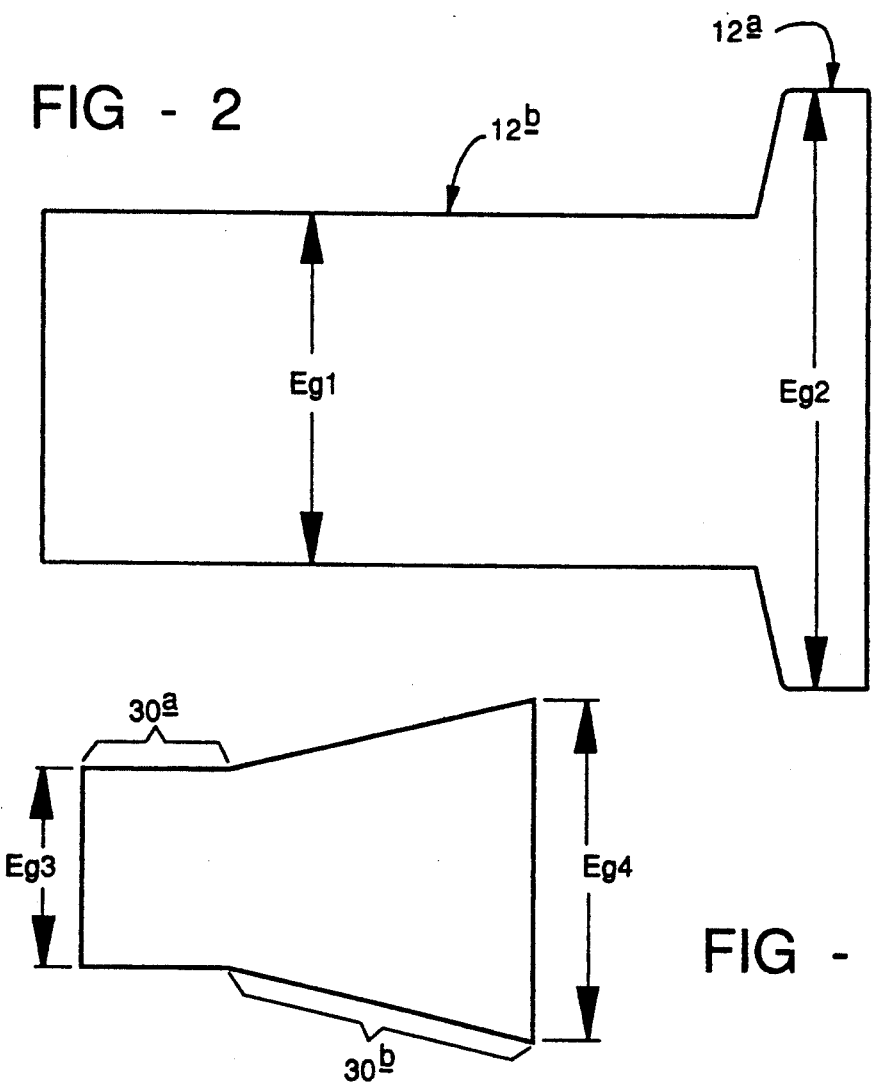
FIG - 2
FIG - 3

SEMICONDUCTOR DEVICE AND MICROWAVE PROCESS FOR ITS MANUFACTURE

FIELD OF THE INVENTION

This invention relates generally to semiconductor devices and more particularly to a microwave energized process for their manufacture. Most specifically, the invention relates to photovoltaic devices having an improved open circuit voltage and to a microwave energized plasma process in which bias of the plasma is controlled to influence the physical properties of a portion of at least one of the semiconductor layers comprising the device.

BACKGROUND OF THE INVENTION

Photovoltaic devices provide clean, quiet and reliable sources of electrical power and because of shortages and environmental problems associated with fossil and nuclear fuels and because of recent advances in technology which have significantly decreased the cost and increased the efficiencies of photovoltaic devices, photovoltaic power is of growing commercial importance. Initially photovoltaic devices were manufactured from single crystalline material. These devices were expensive, delicate, fairly bulky and difficult to manufacture in fairly large area configurations. Various techniques have now been developed for preparing thin film semiconductor materials which manifest electrical properties which are equivalent, and in many instances superior to, their single crystalline counterparts. These thin film materials may be readily deposited over very large areas and on a variety of substrates. Such alloys and techniques for their preparation are disclosed, for example, in U.S. Pat. Nos. 4,226,898 and 4,217,374. One important class of photovoltaic devices comprise a layer of intrinsic semiconductor interposed between two oppositely doped semiconductor layers. Such devices are termed P-I-N or N-I-P devices depending on the order of the layers and the two terms shall be used interchangeably herein.

Glow discharge deposition comprises one particularly important class of techniques for the preparation of thin film semiconductor materials. In a glow discharge method a process gas, typically at subatmospheric pressures, is energized by an electrical field so as to produce a plasma comprised of ionized and/or otherwise activated species derived from the process gas. The plasma acts to produce a semiconductor deposit on a substrate maintained in proximity thereto. Initially, such glow discharge deposition processes were energized by direct current, or, more commonly, by alternating current in the radio frequency range. While such techniques produce high quality semiconductor materials, deposition rates obtained thereby are fairly low and significant amounts of process gas are utilized non-productively. Attempts to raise the deposition rate either by increasing the gas pressure or by greatly increasing the power density results in the production of polymeric and oligomeric species which contaminate and degrade the semiconductor layers.

It has been found that microwave energy may be beneficially employed to energize a plasma in a glow discharge deposition process and that a microwave energized plasma process is particularly advantageous for semiconductor fabrication since very high rates of deposition may be achieved concomitant with a greatly enhanced process gas utilization. The application of microwave energy to glow discharge semiconductor depositions is disclosed in U.S. Pat. No. 4,517,223.

While microwave energized processes are attractive because of their high deposition rates and high rates of gas utilization, it has been found that the semiconductor materials deposited thereby are generally of somewhat lower quality than those materials derived from a RF or DC energized plasma. Photovoltaic devices having microwave-produced semiconductor layers have an overall efficiency which is generally lower than that of corresponding RF prepared devices.

Heretofore it has been generally believed that a positive bias should be applied to a microwave generated plasma to enhance the deposition of semiconductor layers. By bias is meant that a charged wire or other electrical conductor is placed in the plasma and functions to repel particularly charged species toward the substrate during the course of the deposition. As disclosed, for example, in U.S. Pat. No. 4,379,943 a bias of approximately 80 volts is applied to a deposition plasma to increase the bombardment of the substrate by positive ions and increased deposition rate and material quality are attributed thereto.

The prior art has applied a fairly high bias to a microwave energized plasma for the entirety of the deposition process and conventional wisdom teaches that such bias is necessary to improve semiconductor material quality. In accord with the present invention, it has been found that increased positive ion bombardment, attendant upon high plasma bias can actually be detrimental to the quality of semiconductor material deposited in a glow discharge process.

Specifically, it has been found that a higher quality of semiconductor material of photovoltaic devices is produced in a microwave energized glow discharge process where positive ion bombardment of the substrate is at least partially limited. Such limitation is accomplished by significantly decreasing or eliminating any positive bias in the plasma or by taking the affirmative step of placing a screening electrode in the plasma to limit positive ion bombardment. It has been found that photovoltaic devices manufactured from semiconductor material produced in this manner have a fill factor which is better than that of devices made from material in which positive ion bombardment is not limited. Fill factor is a measure of photovoltaic device performance determined by plotting the voltage-current curve of the device under illumination and by taking the ratio of the area under the curve versus the area of the corresponding rectangle defined by extending lines normal to the short circuit current and open circuit voltage points on the axes. The higher the fill factor the better the efficiency of the device. While the fill factor of devices made in this manner is generally improved, it has been found that the open circuit voltage of such cells is low.

In accord with the present invention, it has been found that in a microwave deposition process for the manufacture of photovoltaic devices, the open circuit voltage may be increased and the improved fill factor retained, if the plasma bias is appropriately manipulated during a portion of the time during which various of the semiconductor layers are being deposited. Specifically, it has been found that in the preparation of an N-I-P type photovoltaic device, imposition of a high positive bias on a microwave generated plasma only during the deposition of that portion of the intrinsic layer which is proximate one of the doped layers, will improve the cells' open circuit voltage. This improvement occurs concomitant with the broadening of the band gap of the material deposited under the highly positive bias and is believed to be a result of incorporation of additional hydrogen into the semiconductor material.

It has been known to vary the band gap of the intrinsic layer of a photovoltaic device for various purposes; however, in the prior art, such band gap variation is achieved by the addition of various band gap modifying elements to the deposition gas. For example, it has been found that the addition of germanium to a silicon based semiconductor material will narrow the band gap thereof. Similarly, the addition of fluorine to a silicon based material will broaden the band gap. By appropriately changing gas ratios during the deposition, various gap configurations may be achieved. U.S. Pat. No. 4,471,155 discloses a P-I-N type photovoltaic device in which the portion of the intrinsic layer proximate one or both of the doped layer is made of a wider band gap material for purposes of increasing cell voltage. As disclosed therein, a main portion of the intrinsic layer is made of a relatively narrow-gap, germanium-containing material and the interface region is devoid of germanium and has a wider gap. This cell is particularly used in multiple, stacked cell configurations.

U.S. Pat. No. 4,379,943 discloses a P-I-N type cell in which a first doped-intrinsic interface is comprised of a silicon-hydrogen material having a relatively narrow gap and the remainder of the intrinsic body is a silicon-hydrogen-fluorine alloy of wider band gap. This particular structure is used to prevent fluorine etching of the first interface during deposition. U.S. Pat. No. 4,817,082 discloses a graded gap structure in which band gap varies from a fairly wide gap at the doped-intrinsic interface to a narrower gap at an intermediate portion, these variations are resultant from compositional grading within the device. Also disclosed in the '082 patent is the use of a pure hydrogen plasma to passivate interface states in the first doped layer prior to the deposition of the intrinsic layer thereupon. U.S. Pat. No. 4,547,621 also discloses the use of composition variation to enlarge the gap of a photovoltaic device of the P-I-N type, proximate one of the doped-intrinsic interfaces.

The prior art does not recognize that the band gap of a semiconductor alloy, and hence the open circuit voltage of a photovoltaic device including that alloy, may be readily controlled in a microwave energized process by control of plasma bias and hence positive ion bombardment. The present invention provides a simple, easy to apply method by which the hydrogen content of a silicon alloy material may be readily controlled by controlling the bias of the deposition plasma. This control allows for manipulation of the band gap of the material and may be used to manufacture various graded structures. In accord with the present invention, the method may be utilized to manufacture P-I-N or N-I-P type photovoltaic devices having an improved fill factor as well as a good open circuit voltage. These and other advantages of the present invention will be readily apparent from the drawings, discussion and description which follow:

BRIEF DESCRIPTION OF THE INVENTION

There is disclosed herein a method of making an improved semiconductor device of the type having a junction between a layer of intrinsic semiconductor material and a layer of doped semiconductor material. The method includes the steps of providing a deposition chamber; disposing a substrate in the chamber; disposing a bias wire in the chamber proximate the substrate; introducing an intrinsic semiconductor precursor gas into the chamber; energizing the gas with microwave energy to form a plasma which decomposes the gas and deposits a layer of intrinsic semiconductor material on the substrate; energizing the bias wire with a positive voltage in excess of 50 volts during only a portion of the time the intrinsic layer is being deposited and depositing a layer of doped semiconductor material onto the layer of intrinsic semiconductor material. During the portion of the time the intrinsic layer is being deposited and the wire is not energized to the high bias, it may be unbiased, negatively biased or biased to a low voltage i.e., 50 volts or less. The doped layer may be deposited atop the intrinsic layer by a variety of techniques including R.F. microwave or D.C. plasma techniques, evaporation or any other such method.

In particular embodiments, the semiconductor precursor gas includes a group 4A element such as silicon or germanium therein and the doped semiconductor material includes a group 3A or 5A element. The semiconductor precursor gas may include a member selected from the group consisting of $SiF_4$, $SiH_4$, $Si_2H_6$, $GeH_4$, $GeF_4$ and combinations thereof. The step of energizing the bias wire to a high voltage comprises energizing the wire to a positive voltage between 50 and 200 volts. The bias may be constant or it may be a varying bias and in one particularly embodiment, the wire is energized to the high bias for one-half to one-tenth of the time during which the intrinsic layer is being deposited.

The method is particularly suited for manufacturing photovoltaic devices of the type comprising a layer of intrinsic semiconductor material disposed between oppositely doped layers semiconductor material. Also included within the scope of the present invention is a photovoltaic device of the type comprising a layer of intrinsic silicon alloy material disposed between oppositely doped layers of silicon alloy material in which a portion of the body of intrinsic material proximate one of the doped layers has a higher hydrogen content and a larger band gap energy than the remaining portion of the body of intrinsic material.

BRIEF DESCRIPTION OF THE DRAWINGS

FIG. 1 is a cross sectional view of a photovoltaic device structured in accord with the principles of the present invention;

FIG. 2 is a schematic depiction of the band gap of the intrinsic layer of the device of FIG. 1;

FIG. 3 is a schematic depiction of the band gap of another embodiment of intrinsic layer structured in accord with the principles of the present invention;

DETAILED DESCRIPTION OF THE INVENTION

Figure 4:
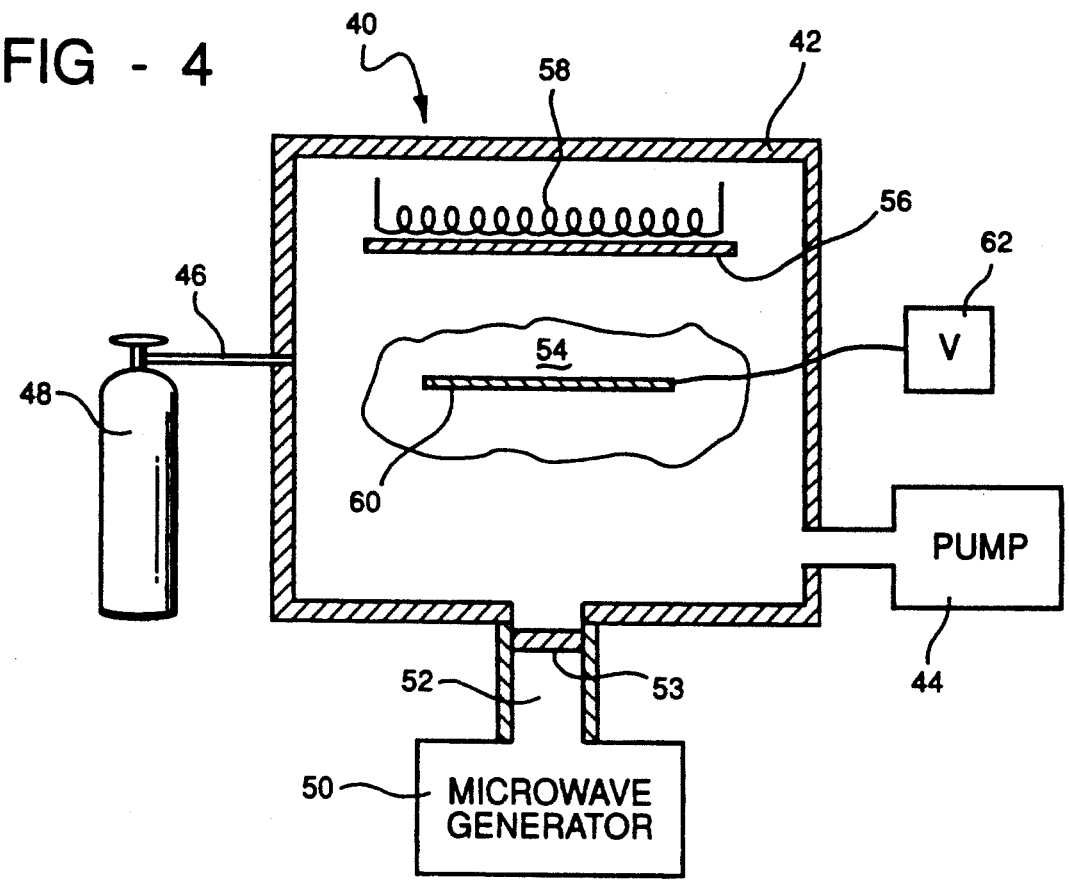
FIG. 4 is a schematic depiction of a deposition apparatus for carrying out the present invention.

Referring now to FIG. 1, there is shown a cross sectional view of a photovoltaic device 10 structured in accord with the principles of the present invention. The device 10 comprises a body of substantially intrinsic, thin film silicon alloy material 12 interposed between a layer of p-doped silicon alloy material 14 and a layer of n-doped silicon alloy material 16. This structure is typical of P-I-N type photovoltaic devices well known in the art. The silicon alloy material may comprise an amorphous, crystalline or polycrystalline alloy material and may include alloying elements such as hydrogen, halogens, germanium, carbon, nitrogen and the like. In the most preferred embodiment, the layer of p-doped semiconductor material 14 is a microcrystalline layer manifesting high electrical conductivity and high transparency.

The photovoltaic device 10 further includes a substrate 18 which is electrically conductive and which functions as a bottom electrode of the device. The substrate 18 may comprise a body of metal such as stainless steel and the like or an insulating material such as glass, ceramic or a polymer, having an electrically conductive coating thereupon. In particular embodiments, the substrate 18 may include a highly reflective layer fabricated of silver or the like and may be texturized to increase light scattering therefrom. The photovoltaic device 10 of FIG. 1 further includes a top electrode layer 20 preferably fabricated from a transparent conductive metal oxide (TCO) such as indium oxide, tin oxide and combinations thereof. In particular embodiments, the photovoltaic device further includes a current collecting grid structure 22 associated with the TCO layer 20 to facilitate an efficient collection of photo-generated current.

It is to be understood that the device 10 of FIG. 1 is merely representative of a typical photovoltaic device and in actual configuration, may comprise an array of vertically stacked P-I-N photovoltaic devices. Also, the device referred to herein as a P-I-N type photovoltaic device may be manufactured in an inverted condition, i.e., with the N layer 16 proximate the TCO electrode 20. Within the context of this disclosure, both structures are equivalent and the principles of the present invention may be applied to both.

In accord with the present invention, the intrinsic layer 12 includes a wide gap portion 12a disposed proximate the interface with the P-doped layer 14. The wide gap portion 12a is distinguished from the remainder 12b of the intrinsic layer by an increased hydrogen content and band gap. It is this layer 12a which is responsible for the increase in open circuit voltage achieved by the structure depicted in FIG. 1.

Referring now to FIG. 2, there is shown a stylized depiction of the band gap of the intrinsic layer 12 of the device of FIG. 1. The intrinsic layer includes a first gap portion 12a having a wide band gap, Eg2, and a remainder portion 12b having a narrower gap, Eg1. It will be noted that there is a fairly abrupt transition between the narrow gap 12b and wide gap 12a regions. As will be described in greater detail hereinbelow, the variation in gap is achieved by changing the plasma bias during the deposition of the intrinsic layer. The narrower gap portion 12b is deposited at a relatively low bias and the higher gap portion 12a is deposited at a higher bias.

In accord with the present invention, other configurations of intrinsic layer may be prepared. For example, the transition between the wide and narrow band gap portions may be fairly sharp or it may be very gradual. In the FIG. 1 embodiment, the wide gap portion 12a is approximately 1/6 to 1/10 of the thickness of the remainder 12b. In other embodiments, the wide gap portion 12a may be as much as ½ of the thickness of the intrinsic region and in general it has been found that a wide gap portion having a thickness in the range of ½-1/10 of the total intrinsic layer thickness is generally preferable. In some embodiments, the band gap of the intrinsic region may be varied throughout substantially all of the thickness thereof through the use of the bias control methods of the present invention. FIG. 3 depicts the band gap structure of another embodiment of intrinsic layer including a first region 30a having a relatively narrow band gap Eg3 and a variable gap region 30b in which the band gap increases from the value Eg3 to Eg4 over the thickness thereof.

Referring now to FIG. 4, there is shown a stylized, cross-sectional depiction of an apparatus 40 which may be used in accord with the principles of the present invention for the microwave energized deposition of semiconductor layers. The apparatus 40 includes a deposition chamber 42 typically comprised of stainless steel or other such material capable of sustaining a low pressure environment therewithin. The deposition chamber includes a vacuum pump 44 associated therewith for producing and sustaining a low pressure environment therewithin. The chamber 42 further includes a gas delivery conduit 46 communicating with the interior thereof and operatively connected to a source of process gases 48 schematically depicted herein as a gas cylinder, although it is to be understood that such source of gas 48 may comprise a bank of cylinders, a gas generator or the like. The deposition apparatus 40 further includes a microwave generator 50, such as a Klystron, magnetron or the like, communicating therewith by means of a wave guide 52. The wave guide 52 interfaces with the chamber 42 through a window 53 which isolates the low pressure chamber 42 from the ambient pressure in the wave guide 52. Such windows are well known in the art and are described in detail in U.S. Pat. No. 4,931,756. It is to be understood that other microwave sources such as a microwave energized antenna may be similarly employed. Also, the microwave energy may be introduced into the chamber 42 through the sides or top of the chamber.

Defined within the deposition chamber 42 is a plasma region 54 in which microwaves from the wave guide 52 interact with process gases from the conduit 46 to produce a plasma comprised of ionized or otherwise activated process gas species. The deposition system further includes a substrate 56 disposed proximate the plasma region 54; and as illustrated, the substrate 56 may have a heater 58, such as a resistance heater, associated therewith.

As is well known to those of skill in the art, the chamber pressure, composition of gases introduced from the conduit 46 and power level of the microwave energy may be selected to create a plasma in the plasma region 54 which will deposit a layer of semiconductor material of a preselected composition onto the substrate 56.

In accord with the present invention, the deposition system 40 further includes a bias wire 60 disposed in the plasma region and in electrical communication with a voltage source 62. In the context of the present disclosure, the member within the plasma region 54 is described as a wire 60, although it is to be understood that a screen, bar, grid, ring or similar member may also be employed.

In accord with the present invention, a relatively high positive bias, typically between 50 and 200 volts is applied to the wire 60 during a portion of the time the intrinsic layer is being deposited and a relatively low positive bias (typically under 50 volts), a negative bias or no bias is applied to the wire during the remainder of the deposition. This high bias serves to broaden the band gap of that material and thereby increase the open circuit voltage of a photovoltaic device including that material. In general, the wide gap portion of the intrinsic layer will be disposed proximate the major junction of the device. As is known to those of skill in the art, an intrinsic layer of semiconductor material is typically not purely intrinsic but is usually slightly P or slightly N type and in most instances, a silicon alloy intrinsic layer is slightly N type. Hence the P-intrinsic junction is the major junction since the greatest band bending occurs there. Hence the wide gap portion of the intrinsic layer is most advantageously placed proximate the major junction. In some instances, the intrinsic material is slightly P type and then the wide band gap portion of the intrinsic layer is most preferentially placed proximate the N-I interface. In other instances it may be desirable to include a wide gap portion proximate each of the interfaces.

The present invention thus will be seen to employ a dual bias methodology. For a portion of the time the intrinsic layer is being deposited, the wire 60 is either unbiased or biased to a low positive voltage, or actually negatively biased. During the remainder of the time the wire 60 is biased to a relatively high positive level. In some instances, a further control structure in the form of a grounded, or biased electrode configured as a screen, rod, grid plate or cylinder may be placed in the plasma to further regulate ionic bombardment.

EXPERIMENTAL

A series of photovoltaic devices were prepared with and without the present invention to assess the effect thereof. The devices were of the type shown in FIG. 1 and were prepared in an apparatus generally similar to that of FIG. 5.

Figure 5:
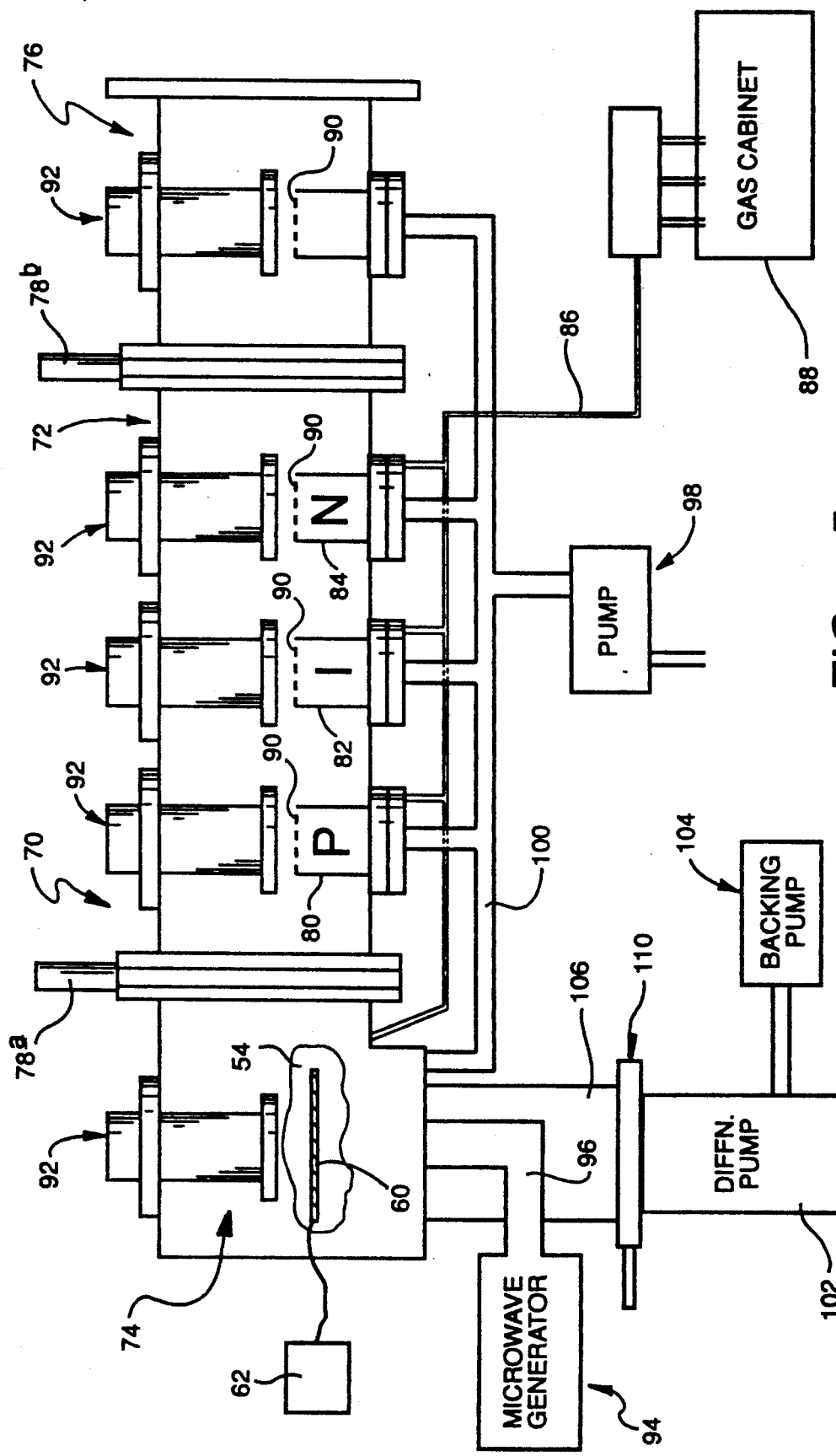
FIG. 5 is a schematic depiction of an R.F.-microwave energized deposition apparatus for the preparation of N-I-P type photovoltaic devices.

FIG. 5 depicts a plasma deposition apparatus 70 operative to deposit a plurality of semiconductor layers upon a substrate. The apparatus 70 is notable insofar as it includes a radio frequency energized deposition chamber 72 as well as a microwave energized deposition chamber 74. In this manner, the apparatus 70 may be used for preparation of semiconductor devices under a variety of conditions. The apparatus 70 further includes a loading chamber 76 for removal and replacement of substrates. Separating the R.F. chamber 72, microwave chamber 74 and loading chamber 76 are gate valves 78a, 78b; and as is well known to those of skill in the art, such valves may be readily opened and closed to allow passage of a fairly large substrate between adjoining chambers.

The R.F. chamber 72 includes three separate deposition regions 80, 82, and 84 adapted to deposit P-type, intrinsic, and N-type semiconductor layers respectively. Toward that end, each deposition region is provided with a gas supply via a manifolded conduit 86 communicating with a gas supply cabinet 88. Each R.F. deposition region 80, 82, 84 includes a cathode 90 which is energized by radio frequency energy via a power supply (not shown). Each R.F. deposition region 80, 82, 84 further includes a substrate holder and heater assembly 92 which retains and heats a deposition substrate. It will noted that the loading chamber 76 also includes a substrate heater assembly 92 and further includes a cathode 90. The heater 92 and cathode 90 may be employed to pretreat the substrate, as for example by plasma cleaning, deposition of particular layers, and the like, as is well known in the art.

Microwave chamber 74 also includes a substrate heater assembly 92, but it will be noted that this chamber 74 includes no cathode assembly. Instead, the microwave chamber is supplied with microwave energy via a microwave generator 94 operatively communicating therewith by a waveguide 96 in a manner generally similar to that of the apparatus of FIG. 4. It will also be noted that the microwave chamber 94 includes a bias wire 60 disposed in the plasma region thereof and in electrical communication with a power supply 62, as generally described with reference to FIG. 4.

The apparatus 70 further includes a process pump 98 operatively communicating with the various chambers via a vacuum conduit 100. It will also be noted that the microwave chamber 74 includes a separate pumping system comprised of a diffusion pump 102 having a backing pump 104 associated therewith and operatively connected to the microwave chamber 74 by a conduit 106 and a gate valve 110. The microwave deposition process typically employs a very high flow of process gas and operates in a pressure regime different from the R.F. energized deposition (e.g., less than 0.1 Torr) and hence the separate pumping system is typically employed to maintain the proper pressure under these dynamic conditions.

The apparatus 70 may be employed to manufacture a variety of configurations of semi-conductor device. In a typical process, a substrate is placed into the loading chamber 76; the pressure therein is lowered and any pretreatment such as plasma cleaning is carried out. The gate valve 78b is then opened and the substrate transferred by a conveyor system (not shown) to either the R.F. or microwave deposition chambers. By employing the appropriate deposition stations in the R.F. chamber 72, various doped or intrinsic base layers may be placed on the substrate. By opening the gate valve 78a and conveying the substrate into the microwave deposition chamber 74, the deposition of semi-conductor layers by microwave energy may be carried out. In accord with the principles of the present invention, control of plasma bias in the microwave chamber 74 may be effected through the use of the bias wire 60 in combination with the power supply 62.

EXAMPLE 1

A P-I-N type photovoltaic device was prepared in accord with prior art techniques. A stainless steel substrate was placed in the N region of the R.F. deposition chamber of an apparatus generally similar to that of FIG. 5. The apparatus was sealed and an atmosphere comprising 20 sccm of hydrogen, 0.75 sccm of a 1% mixture of phosphine in hydrogen, and 0.65 sccm of disilane was flowed therethrough. The pump was adjusted to maintain a pressure of 1.2 torr in the chamber. The substrate heater was energized to maintain the substrate at a temperature of approximately 350° C. The gas mixture was energized with radio frequency energy of 13.56 MHz. The cathode was approximately 3.5 inches in diameter and a power of 2 watts was applied thereto. The deposition conditions were maintained until approximately 200 angstroms of N-doped silicon alloy material was deposited on the substrate at which time cathode power was terminated.

The substrate, bearing the N-layer, was transferred to the microwave chamber and the gas gate thereto closed to seal the chamber from the remainder of the apparatus. An atmosphere of 30 sccm of silane, 70 sccm of helium, and 5 sccm of argon was flowed through the chamber. The pump was adjusted to maintain a pressure of 15 millitorr in the chamber and the substrate was heated to 350° centigrade. Microwave energy of approximately 950 watts at 2.45 GHz was introduced into the chamber. The input of microwaves was maintained for 30 seconds and a layer of intrinsic semiconductor material of approximately 2,000-3,000 angstroms thickness was deposited. During this stage of the deposition a bias of approximately +20 V was maintained on the bias wire. After completion of the deposition of the intrinsic layer, the gate valve 78a was again opened and the coated substrate conveyed to the P region 80 of the R.F. deposition chamber 72. The chamber was sealed and an atmosphere of 95 sccm hydrogen, 3.25 sccm of a 2% mixture of BF$_3$ in hydrogen, and 2.5 sccm of a 5% mixture of silane in hydrogen was flowed through the chamber. The pump was adjusted to maintain a pressure of 1.7 torr in the chamber and the substrate heater energized to maintain the substrate at a temperature of 175° C. The cathode was approximately 2.7 inches in diameter and was energized with 30 watts of radio frequency energy at 13.56 MHz. These conditions provided for the deposition of a microcrystalline layer of p-doped silicon alloy material. The deposition was carried out for a sufficient time to deposit a 100 angstroms thick layer onto the intrinsic layer, at which time the radio frequency energy was terminated and the system purged with argon. The thus completed photovoltaic device was removed from the apparatus and provided with a top electrode of a TCO material in a conventional vacuum evaporation process. The top electrode was approximately 650 angstroms thick.

The photovoltaic device thus produced was tested by measuring its current-voltage characteristics under the illumination of an AM-1.5 solar spectrum. It should be noted that in this experimental series the top contact to the TCO was established through a point contact; no gridlines or other such current collecting structure was used and for this reason the fill factors of these devices are somewhat low. The current-voltage characteristics were graphed in a conventional I-V plot as shown in FIG. 6.

Figure 6:
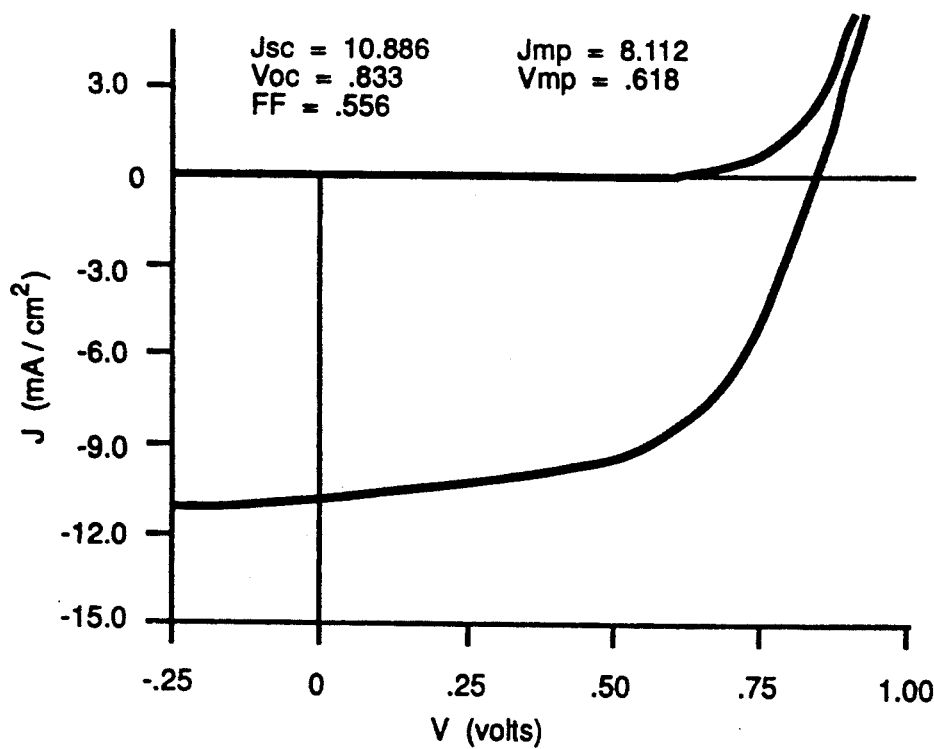
FIG. 6 is an I-V curve of a photovoltaic device having an intrinsic layer manufactured with uniformly low bias.

It will be seen from FIG. 6 that the open circuit voltage of the photovoltaic device is 0.833 V. The short circuit current is approximately 10.8 MA/cm$^2$. The maximum power point current is 8.112 mA/cm$^2$ and the voltage is 0.618 V. The fill factor of this cell is 0.556.

EXAMPLE 2

A second photovoltaic device was prepared as per the previous example except that a bias voltage of +100 V. was maintained on the bias wire during the entirety of the time during which the intrinsic layer was being deposited. The thus produced photovoltaic device was tested in accord with the previously described protocol and the I-V characteristics are shown in FIG. 7.

Figure 7:
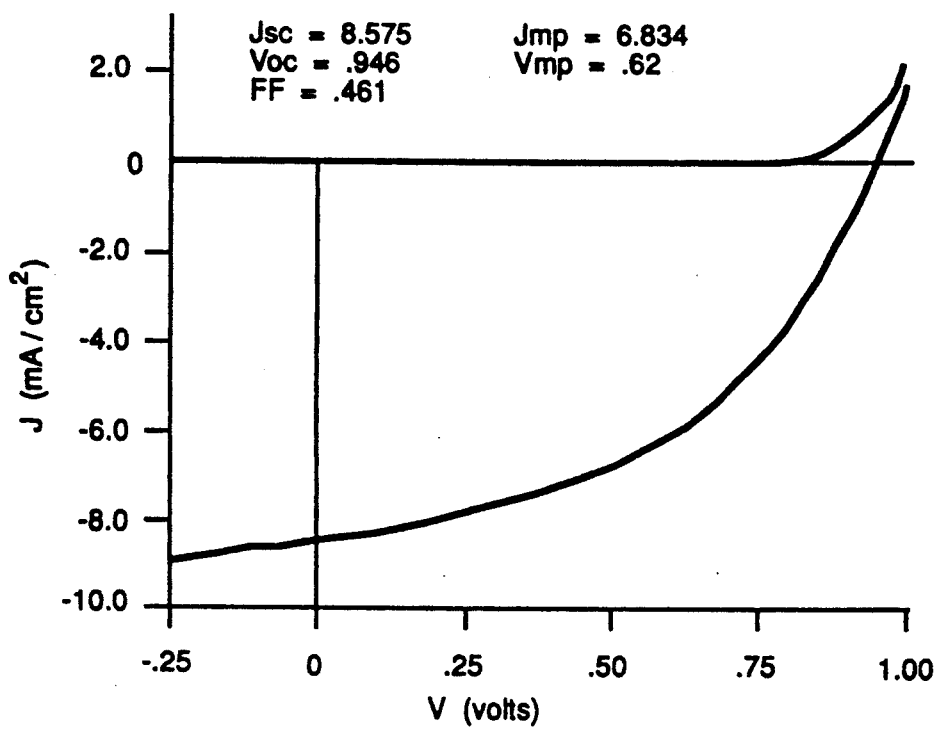
FIGS. 7 and 8 are I-V curves of photovoltaic devices having an intrinsic layer manufactured with uniformly high bias.

Referring now to FIG. 7, it will be seen that the open circuit voltage of this device was 0.946 V. The short circuit current was 8.575 mA/cm$^2$. The maximum power point current was 6.034 mA/cm$^2$ and the voltage 0.62 V. The fill factor of this cell was 0.461. It will be noted that the open circuit voltage of this device is significantly higher than that of Example 1; however, the fill factor has declined and overall cell efficiency has suffered.

EXAMPLE 3

Figure 8:
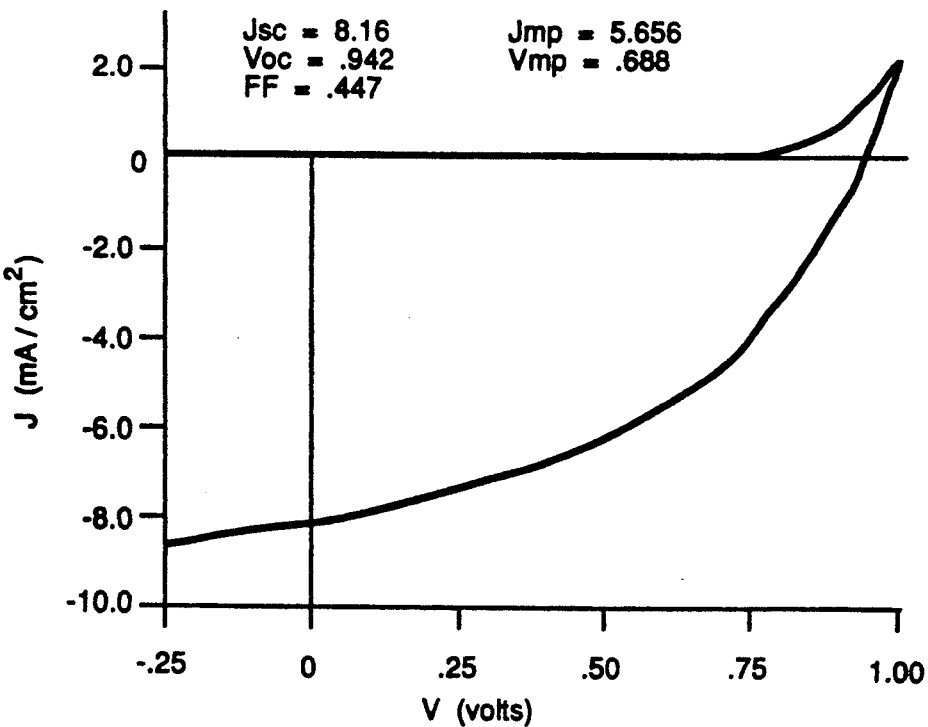

The experiment of Example 2 was repeated exactly and the data therefrom is depicted in FIG. 8. It will be seen that open circuit voltage is 0.942 V, short circuit current of the device is 8.16 mA/cm$^2$. The maximum power point current is 5.656 mA/cm$^2$ and voltage is 0.608 V. Fill factor of this cell is 0.447. Again it will be noted that the constant, high bias has increased open circuit voltage but decreased the fill factor and overall cell efficiency.

EXAMPLE 4

Figure 9:
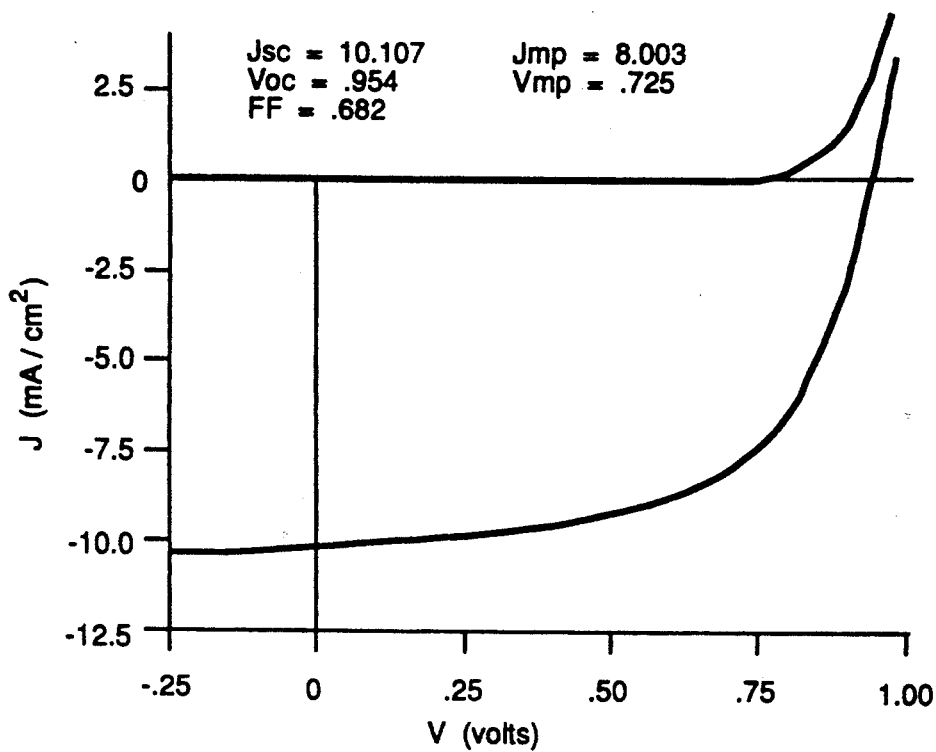
FIGS. 9 and 10 are I-V curves of photovoltaic devices having an intrinsic layer manufactured under dual bias conditions.

In accord with the present invention, a photovoltaic device was prepared as per the previous examples except that for the first 25 seconds during which the intrinsic layer was deposited, the bias voltage was maintained at +20 V and for the remaining 5 seconds of the deposition, the voltage was increased to +100 V. The device produced thereby was tested in accord with the previous examples and the data therefrom is summarized in FIG. 9. It will be noted that this cell has an open circuit voltage of 0.954 V and a short circuit current of 10.187 mA/cm$^2$. The maximum power point current is 8.003 mA/cm$^2$; the voltage is 0.725 V and the fill factor is 0.602.

EXAMPLE 5

Figure 10:
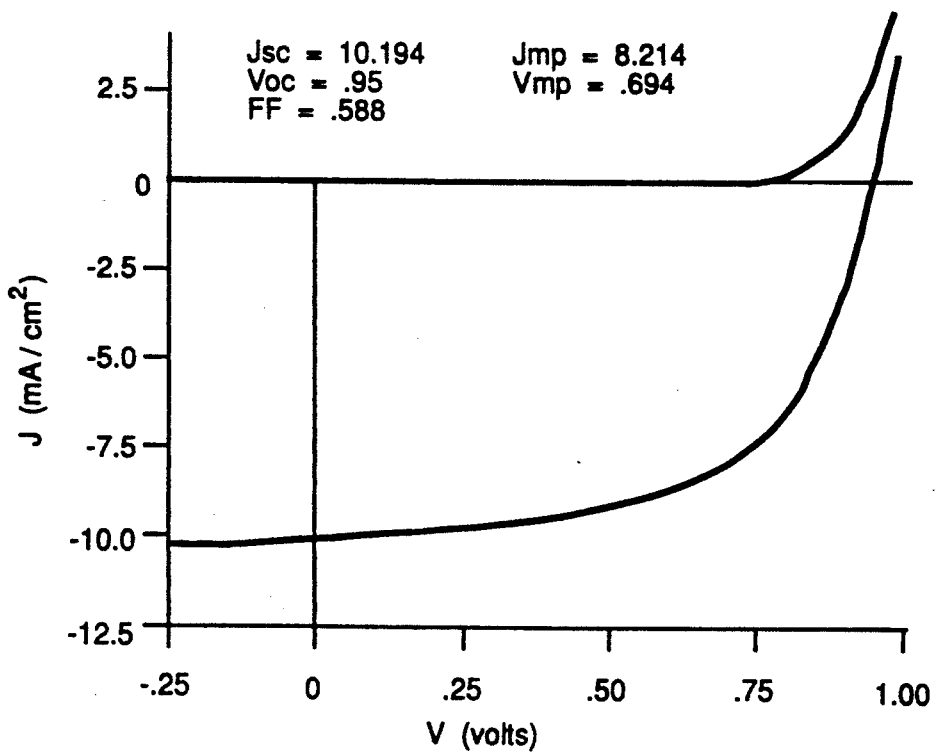

The cell of Example 4 was duplicated in this experiment and measured as per the previous example. Referring now to FIG. 10, it will be seen that the open circuit voltage of this cell is 0.95 V; the short circuit current is 10.194 mA/cm$^2$. The maximum power point current is 8.214 mA/cm$^2$ and the voltage is 0.694 V. The fill factor of this device is 0.588.

It will clearly be seen from the foregoing that the use of the high bias during only a portion of the deposition of the intrinsic layer provides a photovoltaic device having both a high open circuit voltage and a high fill factor. These two properties cannot be achieved in combination in any one cell using uniformly low or uniformly high bias.

It will thus be seen that the present invention provides for the fabrication of photovoltaic devices through the use of rapid, efficient microwave deposition processes without any need to compromise cell performance.

It is to be appreciated that the present invention, although primarily described with reference to the manufacture of photovoltaic devices of P-I-N-type configuration in a mixed R.F.-microwave process, may also be practiced with regard to all other semiconductor devices including a semiconductor junction therein and with processes that are totally energized by microwaves. Specifically, the invention may be practiced with regard to photovoltaic devices of other configurations such as P-N junction, heterojunction, Schottky barrier and other such photovoltaic devices. The invention may also be practiced with regard to other semiconductor devices such as diodes, electrophotographic receptors and the like. In view of the foregoing, it will be appreciated that the drawings, discussion and descriptions herein are merely meant to be illustrative of particular embodiments of the present invention and are not meant to be limitations upon the practice thereof. It is the following claims, including all equivalents, which define the scope of the invention.

We claim:

1. A method of making an improved semiconductor device of the type having a junction between a layer of intrinsic semiconductor material and a layer of doped semiconductor material, said method including the steps of:

providing a deposition chamber;

disposing a substrate in said chamber;

disposing an energizable bias wire in said chamber proximate the substrate;

introducing an intrinsic semiconductor precursor gas into the chamber;

introducing microwave energy into the chamber, said energy operative to form a plasma from, and decompose, said intrinsic semiconductor precursor gas so as to deposit a layer of intrinsic semiconductor material on the substrate;

energizing the bias wire with a positive voltage in excess of 50 volts during only a portion of the time the intrinsic semiconductor layer is being deposited; and, depositing a layer of doped semiconductor material on said layer of intrinsic semiconductor material.

2. A method as in claim 1, wherein said step of introducing an intrinsic semiconductor precursor gas into the chamber comprises introducing a gas including a group 4A element therein.

3. A method as in claim 1, wherein the step of introducing an intrinsic semiconductor precursor gas into the chamber comprises introducing a gas including a member selected from the group consisting of $SiF_4$, $SiH_4$, $Si_2H_6$, $GeII_4$, $GeF_4$, and combinations thereof.

4. A method as in claim 1, including the further step of maintaining said intrinsic semiconductor precursor gas at a pressure of less than 0.1 torr while the microwave energy forms the plasma from said gas.

5. A method as in claim 1, including the further step of maintaining the substrate at an elevated temperature.

6. A method as in claim 1, including the further step of energizing the bias wire with a bias of less than +50 volts during the remainder of the time during which the intrinsic semiconductor layer is being deposited.

7. A method as in claim 1, wherein the step of energizing the bias wire with a positive voltage in excess of 50 volts comprises varying the positive voltage on the bias wire.

8. A method as in claim 1, wherein the step of energizing the bias wire with a positive voltage in excess of +50 volts during one-half to one-tenth of the time during which the intrinsic semiconductor is being deposited.

9. A method as in claim 1, wherein the step of disposing a substrate in the deposition chamber comprises disposing a substrate having a doped semiconductor layer of a first conductivity type thereupon in said chamber.

10. A method as in claim 9 wherein the step of depositing a layer of doped semiconductor material on said layer of intrinsic semiconductor material comprises depositing a doped layer of a second conductivity type which is opposite said first conductivity type.

11. A method of making an improved photovoltaic device of the type comprising a layer of intrinsic semiconductor material disposed between oppositely doped layers of semiconductor material, said method including the steps of:

providing a deposition chamber, said chamber having a plasma region defined therein;

disposing a bias wire in the plasma region;

disposing a source of microwave energy, so as to introduce microwave energy into the plasma region of the deposition chamber;

disposing a substrate having a first, doped semiconductor layer of a first conductivity type disposed upon at least a portion thereof in said plasma region;

introducing an intrinsic semiconductor precursor gas into said chamber;

introducing microwave energy into said chamber so as to energize said intrinsic semiconductor precursor gas so as to create a plasma therefrom which decomposes said intrinsic precursor gas and deposits a layer of intrinsic semiconductor material onto said first doped semiconductor layer;

energizing said bias wire with voltage of at least +50 volts during a first portion of the time the microwaves are energizing the intrinsic semiconductor precursor gas and with a bias of less than +50 volts during a second portion of the time the microwaves are energizing the intrinsic semiconductor precursor gas;

depositing a second doped semiconductor layer atop said layer of intrinsic semiconductor material, said second doped semiconductor layer being of opposite conductivity type to said first doped semiconductor layer.

12. A method as in claim 11, where the step of introducing an intrinsic, semiconductor precursor gas comprises introducing a silicon-containing gas.

13. A method as in claim 11, wherein the step of disposing a substrate having a first, doped, semiconductor layer comprises disposing a substrate having a semiconductor layer including a group 5A and a group 4A element therein and the step of depositing a second, doped, semiconductor layer comprises depositing a semiconductor layer including a group 3A and a group 4A element therein.

14. A method as in claim 11, wherein the step of disposing a substrate having a first, doped semiconductor layer comprises disposing a substrate having a semiconductor layer including a group 3A and a group 4A element therein and the step of depositing a second, doped, semiconductor layer comprises depositing a semiconductor layer including a group 5A and a group 4A element therein.

15. A method as in claim 11, wherein said second portion of time is greater than said first portion.

16. A method as in claim 11, wherein the step of energizing said bias wire to a voltage of at least +50 volts comprises varying the voltage on the bias wire.

* * * * *